United States Patent
Matsukura et al.

(10) Patent No.: US 11,799,051 B2
(45) Date of Patent: *Oct. 24, 2023

(54) NITRIDE SEMICONDUCTOR LIGHT-EMITTING ELEMENT AND METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Tetsuhiko Inazu, Ishikawa (JP); Cyril Pernot, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 293 days.

This patent is subject to a terminal disclaimer.

(21) Appl. No.: 17/351,328

(22) Filed: Jun. 18, 2021

(65) Prior Publication Data

US 2021/0399162 A1 Dec. 23, 2021

(30) Foreign Application Priority Data

Jun. 23, 2020 (JP) ................................ 2020-107600

(51) Int. Cl.
*H01L 33/00* (2010.01)
*H01L 33/06* (2010.01)
*H01L 33/32* (2010.01)

(52) U.S. Cl.
CPC ...... *H01L 33/0025* (2013.01); *H01L 33/0075* (2013.01); *H01L 33/06* (2013.01); *H01L 33/32* (2013.01)

(58) Field of Classification Search
CPC ......... H01L 33/32; H01L 33/06; H01L 33/14; H01L 33/145; H01L 33/0025; H01L 33/0075

See application file for complete search history.

(56) References Cited

U.S. PATENT DOCUMENTS 10,147,842 B2 * 12/2018 Fujita ................. H01L 21/0262
10,283,671 B2     5/2019 Fujita et al.
(Continued)

FOREIGN PATENT DOCUMENTS

JP       2014-120646 A1    6/2014
JP        6001756 B2      10/2016
(Continued)

OTHER PUBLICATIONS

Taiwanese Office Action dated May 3, 2022 from related application TW 110120616 together with English translation.
(Continued)

*Primary Examiner* — Savitri Mulpuri
(74) *Attorney, Agent, or Firm* — Scully, Scott, Murphy & Presser, PC

(57) ABSTRACT

A nitride semiconductor light-emitting element includes a light-emitting layer comprising a well layer comprising AlGaN and emitting ultraviolet light; an electron blocking layer being located on the light-emitting layer and comprising AlGaN with a first Al composition ratio higher than an Al composition ratio of the well layer; and a p-type cladding layer being located on the electron blocking layer, comprising AlGaN with a second Al composition ratio higher than the Al composition ratio of the well layer and lower than the first Al composition ratio, and being doped with a predetermined concentration of a p-type dopant. An interface between the electron blocking layer and the p-type cladding layer is doped with not less than a predetermined amount of an n-type dopant.

7 Claims, 6 Drawing Sheets

(56) References Cited

U.S. PATENT DOCUMENTS

| | | |
|---|---|---|
| 10,505,074 B2 | 12/2019 | Asada et al. |
| 10,686,098 B2 | 6/2020 | Asada et al. |
| 11,227,974 B2* | 1/2022 | Furusawa ............... H01L 33/06 |
| 11,322,654 B2* | 5/2022 | Matsukura ............. H01L 33/32 |
| 11,404,603 B2* | 8/2022 | Matsukura .......... H01L 33/0025 |
| 11,444,222 B2* | 9/2022 | Furusawa ............... H01L 33/06 |
| 2013/0082237 A1* | 4/2013 | Northrup ................ H01L 33/04 257/E33.035 |
| 2016/0268477 A1* | 9/2016 | Fujita ...................... H01L 33/32 |
| 2017/0062660 A1 | 3/2017 | Furuyama |
| 2018/0166604 A1 | 6/2018 | Fujita et al. |
| 2018/0287014 A1* | 10/2018 | Asada ................... H01L 33/145 |
| 2019/0081203 A1 | 3/2019 | Fujita et al. |
| 2019/0371968 A1 | 12/2019 | Asada et al. |
| 2021/0066548 A1* | 3/2021 | Wada ...................... H01L 33/32 |

FOREIGN PATENT DOCUMENTS

| | | |
|---|---|---|
| JP | 2017-045798 A1 | 3/2017 |
| JP | 2019-083221 A1 | 5/2019 |
| TW | 201724560 A | 7/2017 |

OTHER PUBLICATIONS

Taiwanese Office Action dated Sep. 27, 2022 from related application TW 110120616 together with English translation.
Taiwanese Office Action dated Nov. 5, 2021 from related application TW 110120616.
Japanese Notice of Reasons for Refusal dated Nov. 24, 2021 from related application JP 2020-107600.
Japanese Notice of Reasons for Refusal dated Jan. 6, 2022 from related application JP 2020-107600.

\* cited by examiner

NITRIDE SEMICONDUCTOR LIGHT-EMITTING ELEMENT AND METHOD FOR MANUFACTURING NITRIDE SEMICONDUCTOR LIGHT-EMITTING ELEMENT

CROSS-REFERENCE TO RELATED APPLICATION

The present application is based on Japanese Patent Application No. 2020-107600 filed on Jun. 23, 2020, the entire contents of which are incorporated herein by reference.

BACKGROUND OF THE INVENTION

1. Field of the Invention

The invention relates to a nitride semiconductor light-emitting element and a method for manufacturing a nitride semiconductor light-emitting element.

2. Related Art

Some conventional nitride semiconductor light-emitting elements include a light-emitting layer that is made of, e.g., AlGaN and emits deep ultraviolet light (see, e.g., Japanese Patent No. 6001756).

The nitride semiconductor light-emitting element described in Japanese Patent No. 6001756 has a stacked structure in which an n-type semiconductor layer, a light-emitting layer having a quantum well structure composed of well and barrier layers including AlGaN, an electron blocking layer with an Al composition ratio higher than that of the barrier layers, a p-type cladding layer formed on the electron blocking layer, and a p-type contact layer formed on the p-type cladding layer are stacked.

In the nitride semiconductor light-emitting element described in Japanese Patent No. 6001756, however, since the electron blocking layer with a high Al composition is provided, a difference in the Al composition between the electron blocking layer and the p-type cladding layer is large and quality deterioration may be caused by lattice mismatch, leading to shorter emission lifetime.

THE SUMMARY OF THE INVENTION

Therefore, it is an object of the invention to provide a nitride semiconductor light-emitting element which can suppress a decrease in emission lifetime even when including an electron blocking layer with an Al composition ratio of not less than a predetermined value, and a method for manufacturing such a nitride semiconductor light-emitting element.

To solve the problem described above, the invention provides a nitride semiconductor light-emitting element, comprising:

a light-emitting layer comprising a well layer comprising AlGaN and emitting ultraviolet light;

an electron blocking layer being located on the light-emitting layer and comprising AlGaN with a first Al composition ratio higher than an Al composition ratio of the well layer; and a p-type cladding layer being located on the electron blocking layer, comprising AlGaN with a second Al composition ratio higher than the Al composition ratio of the well layer and lower than the first Al composition ratio, and being doped with a predetermined concentration of a p-type dopant, wherein an interface between the electron blocking layer and the p-type cladding layer is doped with not less than a predetermined amount of an n-type dopant.

The invention also provides a method for manufacturing a nitride semiconductor light-emitting element, comprising:

forming a light-emitting layer comprising a well layer comprising AlGaN and emitting ultraviolet light;

forming, on the light-emitting layer, an electron blocking layer comprising AlGaN with a first Al composition ratio higher than an Al composition ratio of the well layer;

intermittently supplying an n-type dopant and a p-type dopant onto an upper surface of the electron blocking layer; and forming, on the electron blocking layer, a p-type cladding layer comprising AlGaN with a second Al composition ratio higher than the Al composition ratio of the well layer and lower than the first Al composition ratio and being doped with a predetermined concentration of a p-type dopant.

Effects of the Invention

According to the present invention, it is possible to provide a nitride semiconductor light-emitting element which can suppress a decrease in emission lifetime even when including an electron blocking layer with an Al composition ratio of not less than a predetermined value, and a method for manufacturing such a nitride semiconductor light-emitting element.

BRIEF DESCRIPTION OF THE DRAWINGS

Next, the present invention will be explained in more detail in conjunction with appended drawings, wherein:

FIGS. 2A and 2B are schematic diagrams illustrating an example of a control to switch between Si supply and Mg supply, wherein FIG. 2A is a timing chart and FIG. 2B is a diagram illustrating end positions of layers during growth corresponding to the timing shown in FIG. 2A;

FIGS. 3A and 3B are diagrams illustrating comparisons of profiles of Si concentrations and Mg concentrations in Examples and Comparative Example, wherein FIG. 3A is a diagram illustrating an example of Si concentration profiles and FIG. 3B is a diagram illustrating an example of Mg concentration profiles;

FIGS. 4A and 4B are graphs showing comparisons of the Si concentrations and the Mg concentrations in intermediate layers of Examples and Comparative Example, wherein FIG. 4A is a graph showing Si peak concentrations and FIG. 4B is a graph showing the Mg concentrations;

FIGS. 5A and 5B are graphs showing comparisons of the Si concentrations and the Mg concentrations in p-type cladding layers of Examples and Comparative Example, wherein FIG. 5A is a graph showing the Si concentrations and FIG. 5B is a graph showing the Mg concentrations; and FIGS. 6A and 6B are graphs showing comparisons of initial outputs and residual outputs in Examples and Comparative Example, wherein FIG. 6A is a graph showing the initial outputs and FIG. 6B is a graph showing the residual outputs.

DESCRIPTION OF THE PREFERRED EMBODIMENT

An embodiment of the invention will be described in reference to the drawings. The embodiment below is described as a preferred example for implementing the invention. Although some part of the embodiment specifically illustrates various technically preferable matters, the technical scope of the invention is not limited to such specific aspects.

(Configuration of Nitride Semiconductor Light-Emitting Element)

Figure 1:
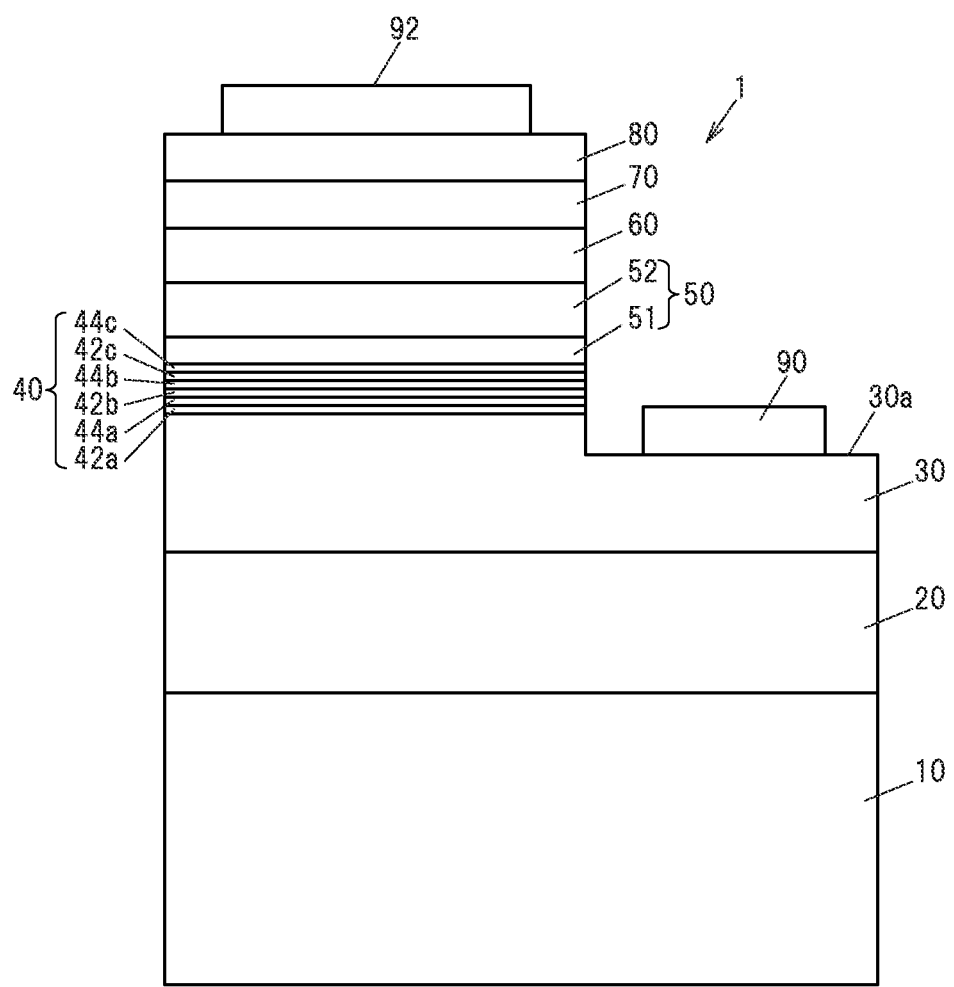
FIG. 1 is a schematic diagram illustrating a configuration of a nitride semiconductor light-emitting element in an embodiment of the present invention.

FIG. 1 is a schematic diagram illustrating a configuration of a nitride semiconductor light-emitting element in an embodiment of the invention. A scale ratio of each constituent element shown in FIG. 1 is not necessarily the same as the actual scale ratio of the nitride semiconductor light-emitting element. A nitride semiconductor light-emitting element 1 (hereinafter, also simply referred to as "light-emitting element 1") includes, e.g., laser diode or light-emitting diode (LED). In the present embodiment, a light-emitting diode (LED) which emits ultraviolet light (including deep ultraviolet light) at a central wavelength of not less than 250 nm and not more than 360 nm will be described as an example of the light-emitting element 1.

As shown in FIG. 1, the light-emitting element 1 includes a substrate 10, a buffer layer 20, an n-type cladding layer 30, a light-emitting layer 40, an electron blocking stack body 50, an intermediate layer 60, a p-type cladding layer 70 and a p-type contact layer 80 in this order. In addition, the light-emitting element 1 further includes a cathode-side electrode (also referred to as an "n-side electrode") 90 provided on the n-type cladding layer 30, and an anode-side electrode (also referred to as a "p-side electrode") 92 provided on the p-type contact layer 80. Next, each constituent element will be described.

(1) Substrate 10

For example, a sapphire substrate made of sapphire ($Al_2O_3$) is used as the substrate 10. Alternatively, the substrate 10 may be an AlN single crystal substrate made of aluminum nitride (AlN).

(2) Buffer Layer 20

The buffer layer 20 is a layer made of AlN or AlGaN. A film thickness of the buffer layer 20 is preferably not less than 1.5 μm and not more than 4.5 μm so that the buffer layer 20 is flat. The buffer layer 20 may have a single layer structure or may have a multilayer structure. In addition, the buffer layer 20 may not be necessarily included.

(3) n-Type Cladding Layer 30

The n-type cladding layer 30 is a layer made of n-type AlGaN and is, e.g., an AlGaN layer doped with silicon (Si) as an n-type impurity (hereinafter, also referred to as an "n-type dopant"). Alternatively, oxygen (O), germanium (Ge), selenium (Se) or tellurium (Te), etc., may be used as the n-type dopant. The n-type cladding layer 30 has a film thickness of not less than 1 μm and not more than 4 μm and preferably has a film thickness of not less than 2 μm and not more than 3 μm. The n-type cladding layer 30 may have a single layer structure or may have a multilayer structure.

(4) Light-Emitting Layer 40

The light-emitting layer 40 is a layer in which barrier layers 42a, 42b, 42c made of AlGaN and well layers 44a, 44b, 44c made of AlGaN with an Al composition ratio lower than an Al composition ratio of AlGaN constituting the barrier layers 42a, 42b, 42c are alternately stacked from the n-type cladding layer 30-side. The light-emitting layer 40 is configured to have a band gap of not less than 3.4 eV so that deep ultraviolet light at a central wavelength of not more than 360 nm is emitted.

Although a multiple quantum well structure having three barrier layers 42a, 42b, 42c and three well layers 44a, 44b, 44c is provided in the present embodiment, the numbers of the barrier layers 42a, 42b, 42c and the well layers 44a, 44b, 44c are not necessarily limited to three each, and may be two each or not less than four each. Alternatively, a single quantum well structure having one each of the barrier layer and the well layer may be provided.

(5) Electron Blocking Stack Body 50

The electron blocking stack body 50 has a configuration in which plural electron blocking layers 51, 52 are stacked. The electron blocking stack body 50 serves to suppress outflow of electrons toward the intermediate layer 60. The electron blocking stack body 50 in the present embodiment has a configuration in which a first electron blocking layer 51 located on the light-emitting layer 40-side and a second electron blocking layer 52 located on the first electron blocking layer 51 are stacked. The second electron blocking layer 52 is an example of an "electron blocking layer".

The first electron blocking layer 51 and the second electron blocking layer 52 are layers made of p-type AlGaN and are, e.g., AlGaN layers doped with magnesium (Mg) as a p-type impurity (hereinafter, also referred to as a "p-type dopant"). Alternatively, zinc (Zn), beryllium (Be), calcium (Ca), strontium (Sr), barium (Ba) or carbon (C), etc., may be used as the p-type dopant.

An Al composition ratio of AlGaN constituting the first electron blocking layer 51 is higher than an Al composition ratio of AlGaN constituting the second electron blocking layer 52. Then, the Al composition ratio of AlGaN constituting the second electron blocking layer 52 is higher than the Al composition ratio of AlGaN constituting the well layers 44a, 44b, 44c. The Al composition ratio of the second electron blocking layer 52 is an example of a "first Al composition ratio".

The first electron blocking layer 51 and the second electron blocking layer 52 may not necessarily be made of p-type AlGaN and may be made of neutral AlGaN. In addition, the second electron blocking layer 52 may not be necessarily included. Furthermore, the electron blocking stack body 50 may include not less than three electron blocking layers.

(6) Intermediate Layer 60

The intermediate layer 60 acts as a dislocation suppression layer that suppresses occurrence or growth of crystal defects such as dislocation and thereby improves crystal quality. The intermediate layer 60 is made of p-type AlGaN doped with not less than a predetermined amount of an n-type dopant. The intermediate layer 60 is an example of a "co-doped layer". An Al composition ratio of the intermediate layer 60 takes a value between the Al composition ratio of the second electron blocking layer 52 and the Al composition ratio of the p-type cladding layer 70. The intermediate layer 60 may not necessarily be made of p-type AlGaN and may be made of n-type AlGaN or neutral AlGaN.

[n-Type Dopant]

The n-type dopant included in the intermediate layer 60 is preferably Si. Oxygen, germanium, selenium or tellurium, etc., mentioned above may be also used as the n-type dopant included in the intermediate layer 60.

In addition, a distribution of the concentration of the n-type dopant in a height direction of the light-emitting element 1 has a local maximum (hereinafter, also referred to as a "concentration peak") in the intermediate layer 60. In other words, a concentration peak of the n-type dopant in the height direction of the light-emitting element 1 is present between the second electron blocking layer 52 and the p-type cladding layer 70.

A value of the concentration peak (hereinafter, also referred to as a "concentration peak value" or "peak concentration") of this n-type dopant is not less than $4.0 \times 10^{18}$ cm$^{-3}$ and not more than $1.0 \times 10^{20}$ cm$^{-3}$, preferably, $5.0 \times 10^{18}$ cm$^{-3}$ and not more than $5.0 \times 10^{19}$ cm$^{-3}$. The unit of concentration here is the number/cm$^{-3}$ (atoms cm$^{-3}$), but hereinafter, it is also simply described as "cm$^3$" with omission of the letters "atoms".

[p-Type Dopant]

The p-type dopant included in the intermediate layer 60 is preferably Mg. Zinc, beryllium, calcium, strontium, barium or carbon, etc., mentioned above may be also used as the p-type dopant included in the intermediate layer 60. A concentration of this p-type dopant is not less than $1.0 \times 10^{18}$ cm$^{-3}$ and not more than $1.0 \times 10^{20}$ cm$^{-3}$. Preferably, the p-type dopant has a concentration peak in the intermediate layer 60. In other words, the concentration peak of the p-type dopant in the height direction of the light-emitting element 1 is present between the second electron blocking layer 52 and the p-type cladding layer 70.

(7) p-Type Cladding Layer 70

The p-type cladding layer 70 is a layer made of AlGaN. An Al composition ratio of AlGaN constituting the p-type cladding layer 70 is higher than the Al composition ratio of AlGaN constituting the well layers 44a, 44b, 44c. The Al composition ratio of AlGaN constituting the p-type cladding layer 70 is an example of a "second Al composition ratio".

The p-type cladding layer 70 has a film thickness of not less than 10 nm and not more than 1000 nm and preferably has a film thickness of not less than 20 nm and not more than 800 nm. In addition, the p-type cladding layer 70 includes a region in which the above-described n-type dopant doped into the intermediate layer 60 is diffused from the intermediate layer 60 and reaches a predetermined position from an end on the second electron blocking layer 52-side (i.e., an interface with the intermediate layer 60). In other words, the p-type cladding layer 70 includes a diffusion region in which the n-type dopant is diffused from the intermediate layer 60. "Diffusion" here means that the n-type dopant doped into the intermediate layer 60 is driven by heat applied during crystal growth of the p-type cladding layer 70 and migrates to the p-type cladding layer 70.

[p-Type Dopant]

The p-type dopant included in the p-type cladding layer 70 is preferably Mg. Zinc, beryllium, calcium, strontium, barium or carbon, etc., mentioned above may be also used as the p-type dopant included in the p-type cladding layer 70. A concentration of this p-type dopant is not less than $1.0 \times 10^{18}$ cm$^{-3}$ and not more than $1.0 \times 10^{20}$ cm$^{-3}$.

[n-Type Dopant]

The n-type dopant included in the p-type cladding layer 70 is preferably Si. Oxygen, germanium, selenium or tellurium, etc., mentioned above may be also used as the n-type dopant included in the p-type cladding layer 70. It is considered that this n-type dopant is bonded to the inert p-type dopant (Mg in this example) not contributing to turn AlGaN into p-type and thereby acts to suppress a decrease in light output of the light-emitting element 1 that can occur due to diffusion of the p-type dopant into the light-emitting layer 40 when supplying power to the light-emitting element 1.

The concentration of the n-type dopant included in the p-type cladding layer 70 is not more than ½, preferably not less than 1/80 and not more than ¼, of the concentration of the p-type dopant included in the p-type cladding layer 70.

(8) p-Type Contact Layer 80

The p-type contact layer 80 is, e.g., a p-type GaN layer doped with a high concentration of p-type dopant such as Mg. Alternatively, the p-type contact layer 80 may be, e.g., a layer made of p-type AlGaN with the Al composition ratio of not more than 10%.

(9) n-Side Electrode 90

The n-side electrode 90 is formed on a certain region of the n-type cladding layer 30. The n-side electrode 90 is made of, e.g., a multilayered film formed by sequentially stacking titanium (Ti), aluminum (Al), Ti and gold (Au) on the n-type cladding layer 30.

(10) p-Side Electrode 92

The p-side electrode 92 is formed on the p-type contact layer 80. The p-side electrode 92 is made of, e.g., a multilayered film formed by sequentially stacking nickel (Ni) and gold on the p-type contact layer 80. Alternatively, a reflective electrode made of rhodium (Rh), etc., may be used as the p-side electrode 92.

(Method for Manufacturing Light-Emitting Element 1)

Next, a method for manufacturing the light-emitting element 1 will be described. Here, two methods ("the method 1" and "the method 2") will be described as examples.

<Method 1>

Firstly, the buffer layer 20, the n-type cladding layer 30, the light-emitting layer 40, the first electron blocking layer 51 and the second electron blocking layer 52 are sequentially formed (hereinafter, also describe as "deposited") on the substrate 10 by high temperature growth. Each layer is formed in a chamber.

The buffer layer 20, the n-type cladding layer 30, the light-emitting layer 40, the first electron blocking layer 51 and the second electron blocking layer 52 may be formed by a well-known epitaxial growth method such as Metal Organic Chemical Vapor Deposition (MOCVD) method, Molecular Beam Epitaxy (MBE) method, or Hydride Vapor Phase Epitaxy (HVPE) method. To supply AlGaN, trimethylaluminum (TMA) is used as an Al source, trimethylgallium (TMG) is used as a Ga source, and ammonia (NH$_3$) is used as an N source.

After depositing up to the second electron blocking layer 52, the object in a state in which layers up to the second electron blocking layer 52 are deposited (hereinafter, also referred to as an "intermediate body") is taken out of the chamber into the atmosphere once. Next, the intermediate body taken out of the chamber is treated so as to be doped with Si and O and is then returned to the chamber again. The treatment here includes, e.g., providing another step such as an evaluation step using the PL (Photo Luminescence) method, but it can be any method as long as doping of Si and O is achieved. Next, the p-type cladding layer 70 is deposited on the second electron blocking layer 52 using the epitaxial growth method described above. Silicon and oxygen are introduced into the interface between the second electron blocking layer 52 and the p-type cladding layer 70 when the intermediate body is taken out into the atmosphere. In this way, the intermediate layer 60 doped with both Si and O is formed between the second electron blocking layer 52 and the p-type cladding layer 70.

After depositing the p-type cladding layer 70, the p-type contact layer 80 is further stacked on the p-type cladding layer 70 using the epitaxial growth method described above, thereby forming a circular disc-shaped nitride semiconductor stacked body (also called "wafer") with a predetermined diameter (e.g., about 50 mm). Next, a mask is formed on the p-type contact layer 80. Then, a part of the n-type cladding layer 30 in a thickness direction, the light-emitting layer 40, the electron blocking stack body 50, the intermediate layer 60, the p-type cladding layer 70 and the p-type contact layer 80 are removed in the exposed region in which the mask is not formed. These layers may be removed by, e.g., plasma etching.

The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 may be formed by, e.g., a well-known method such as electron beam evaporation method or sputtering method. The light-emitting element 1 shown in FIG. 1 is obtained by cutting this wafer into pieces with a predetermined dimension.

<Method 2>

Next, the method 2 will be described. The detailed description may be omitted for the same procedure as the method 1 described above. The buffer layer 20, the n-type cladding layer 30, the light-emitting layer 40, the first electron blocking layer 51 and the second electron blocking layer 52 are sequentially deposited on the substrate 10 by high temperature growth.

Next, the intermediate layer 60 is formed between the second electron blocking layer 52 and the p-type cladding layer 70 by supplying not less than a predetermined amount of the n-type dopant onto the upper surface of the second electron blocking layer 52. The details will be described in reference to FIG. 2.

Figure 2A:
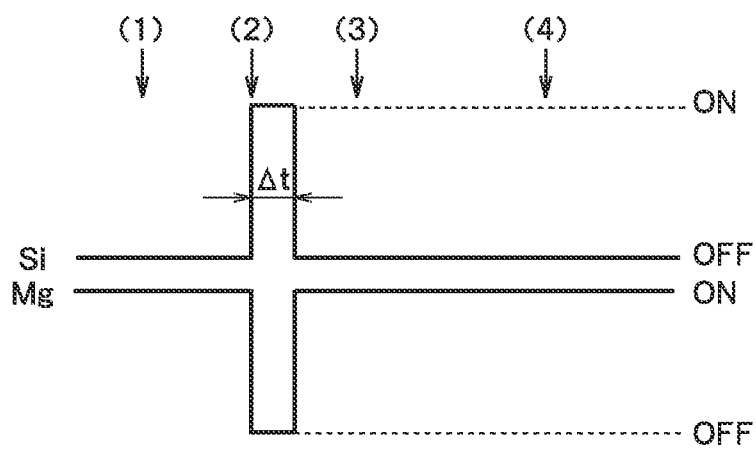
Figure 2B:
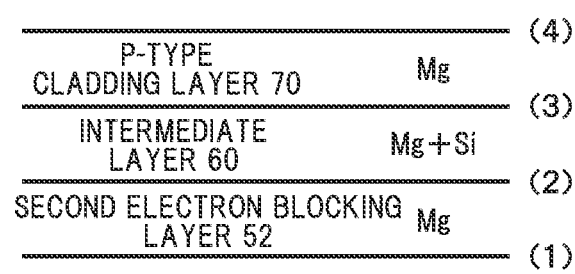

FIG. 2 is a schematic diagram illustrating an example of a control to switch supply between Si as an example of the n-type dopant and Mg as an example of the p-type dopant. In FIG. 2A, the horizontal axis is a temporal axis and the vertical axis indicates whether Si and Mg are supplied or not ("ON" or "OFF"). FIG. 2B is a schematic diagram illustrating end positions of layers during growth corresponding to time indicated by the numbers in brackets shown in FIG. 2A. FIG. 2B shows the dopants that is intentionally introduced during the formation of each layer and does not show a diffused state. For example, TMSi (tetramethylsilane) is used as a Si supply source and $Cp_2Mg$ (biscyclopentadienylmagnesium) is used as a Mg supply source.

As shown in each drawing of FIG. 2, after growing the second electron blocking layer 52 (see "(2)" in FIG. 2B), the n-type dopant and the p-type dopant are supplied intermittently. In particular, the supply of Mg used for growing the second electron blocking layer 52 is stopped ("ON-"→"OFF") and the supply of Si onto the upper surface of the second electron blocking layer 52 is started ("OFF"→"ON"). The Si supply is continued for a certain time (also referred to as "supply time") Δt. The supply time Δt is preferably not less than 5 seconds and within 18 seconds.

Next, after the elapse of the supply time Δt, the Si supply is stopped ("ON"→"OFF") and the Mg supply is started again ("OFF"→"ON"). The intermediate layer 60 including both Si and Mg is thereby formed.

After forming the intermediate layer 60 (see "(3)" in FIG. 2B), the p-type cladding layer 70 is formed on the intermediate layer 60 (see "(4)" in FIG. 2B) using the epitaxial growth method described above. At this time, Si is diffused also in the p-type cladding layer 70.

The process thereafter is the same as that in the method 1 described above. That is, the p-type contact layer 80 is further stacked on the p-type cladding layer 70, a mask is formed on the p-type contact layer 80, and then, a part of the n-type cladding layer 30 in a thickness direction, the light-emitting layer 40, the electron blocking stack body 50, the intermediate layer 60, the p-type cladding layer 70 and the p-type contact layer 80 are removed in the exposed region in which the mask is not formed, the n-side electrode 90 is formed on the exposed surface 30a of the n-type cladding layer 30 (see FIG. 1), the p-side electrode 92 is formed on the p-type contact layer 80 after removing the mask, and the light-emitting element 1 is obtained by cutting the wafer into pieces with a predetermined dimension.

EXAMPLES

Examples according to the embodiment described above will be described in reference to FIGS. 3 to 5. Hereinafter, Examples according to the embodiment described above will be described while comparing four light-emitting elements 1 in Examples 1 to 4 with one light-emitting element in Comparative Example. The light-emitting element 1 in Example 1 was manufactured by the method 1 described above, and each of the light-emitting elements 1 in Examples 2 to 4 was manufactured by the method 2. On the other hand, in Comparative Example, the intermediate layer 60 described above was not included. Dopants used in each Example are summarized in Table 1.

TABLE 1

Types of Dopants

| Layer | Example 1 | Examples 2 to 4 | Comparative Example |
|---|---|---|---|
| Second electron blocking layer 52 | Mg | Mg | Mg |
| Intermediate layer 60 | Mg + Si + O | Mg + Si | — |
| p-type cladding layer 70 | Mg + Si + O | Mg + Si | Mg |

The Al composition ratio of AlGaN constituting each layer in Examples 1 to 4 are summarized in Table 2.

TABLE 2

Al composition ratio of each layer

| Layer | Al composition ratio |
|---|---|
| p-type contact layer 80 | 0.0% (GaN layer) |
| p-type cladding layer 70 | 63.6 ± 6.3% |
| Intermediate layer 60 | 57.3%-82.1% |
| Second electron blocking layer 52 | 74.7 ± 7.4% |
| First electron blocking layer 51 | 100% (AlN layer) |
| Light-emitting layer 40 (well layers 44a-c) | 52.8 ± 5.2% |
| Light-emitting layer 40 (barrier layers 42a-c) | 81.6 ± 8.1% |
| n-type cladding layer 30 | 57.1 ± 5.7% |

Regarding layers other than the p-type contact layer 80 and the first electron blocking layer 51, each layer as a single film was thickened and the value of the Al composition ratio was calculated from wavelength in photoluminescence (PL) measurement.

Figure 3A:
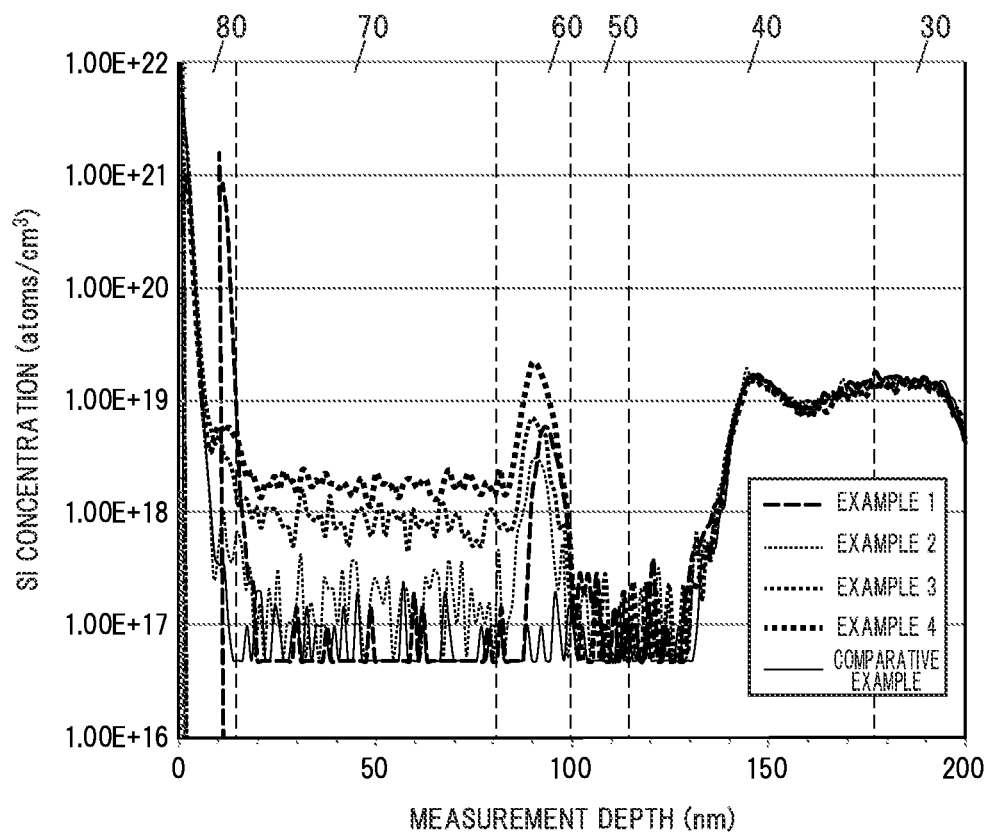
Figure 3B:
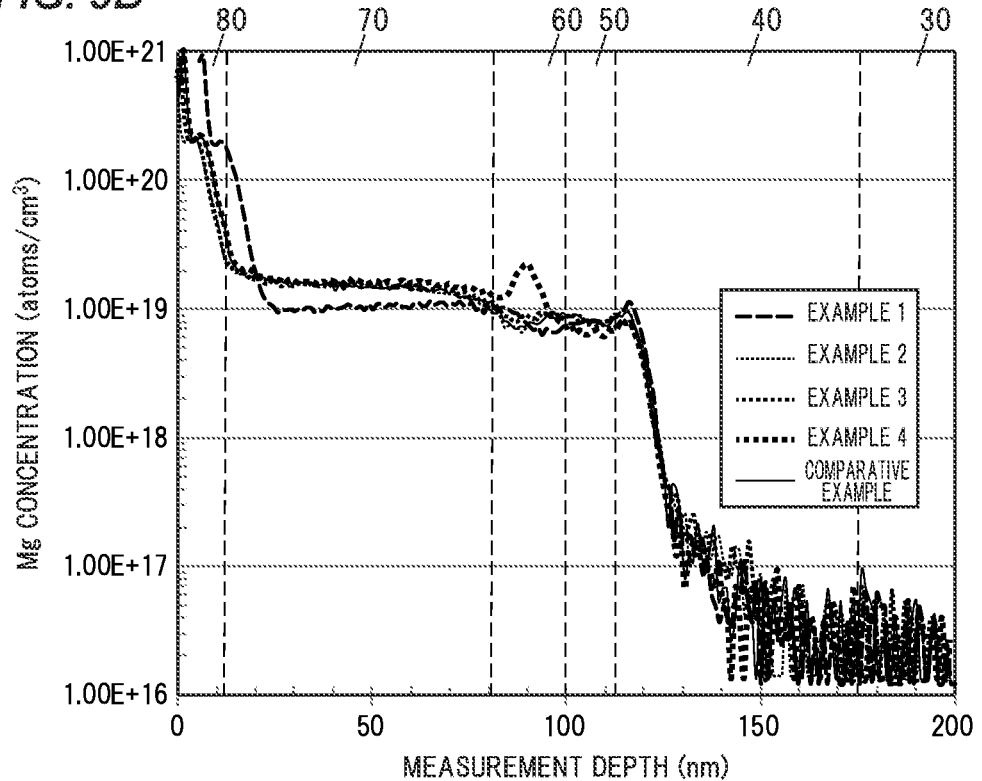

FIGS. 3A and 3B are diagrams illustrating comparisons of profiles of Si concentrations and Mg concentrations in the light-emitting elements 1 of Examples 1 to 4 and in Comparative Example, wherein FIG. 3A is a diagram illustrating an example of Si concentration profiles and FIG. 3B is a diagram illustrating an example of Mg concentration profiles. The Si concentrations shown in FIG. 3A and the Mg concentrations shown in FIG. 3B were respectively calculated based on secondary ion intensity of Al (not shown) measured by SIMS (Secondary Ion Mass Spectrometry). In FIG. 3, the position of the upper surface of the p-type contact layer 80 is shown as the origin of the measurement depth (i.e., the measurement depth=0), and a direction toward the substrate 10 is shown as a positive direction.

In each of the light-emitting elements 1 in Examples 1 to 4, the Si concentration distribution has a local maximum in the intermediate layer 60, as shown in FIG. 3A. On the other hand, in the light-emitting element in Comparative Example, the Si concentration distribution does not have a local maximum at a depth position corresponding to the intermediate layers 60 in Examples 1 to 4. In addition, in case of the light-emitting element 1 in Example 4 among Examples 1 to 4, the Mg concentration distribution also has a local maximum in the intermediate layer 60, as shown in FIG. 3B.

The Si concentration peak value, the O concentration peak value, the n-type dopant concentration peak value and the Mg concentration of the intermediate layer 60 and the Si concentration, the O concentration and the Mg concentration of the p-type cladding layer 70 are summarized in Table 3 below. In this regard, the Mg concentration in the intermediate layer 60 is an average value of the Mg concentration in the depth direction of the intermediate layer 60, and the Si, O and Mg concentrations in the p-type cladding layer 70 are respectively average values of the Si, O and Mg concentrations in the depth direction of the p-type cladding layer 70. In addition, for Example 1, the "n-type dopant peak concentration" is a sum of the "Si peak concentration" and the "O peak concentration", and the "n-type dopant concentration" is a sum of the "Si concentration" and the "O concentration".

Figure 4A:
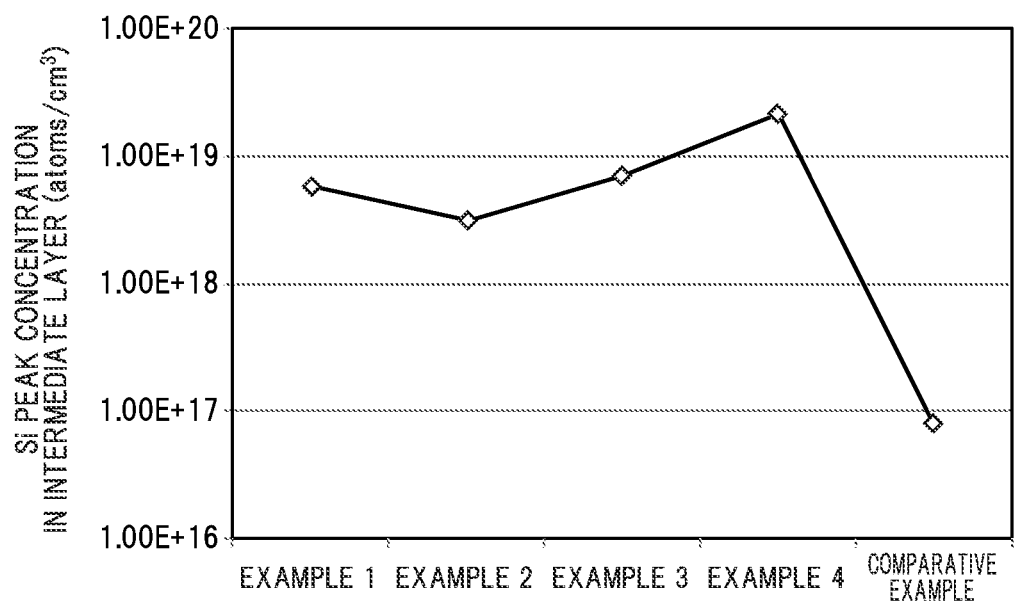
Figure 4B:
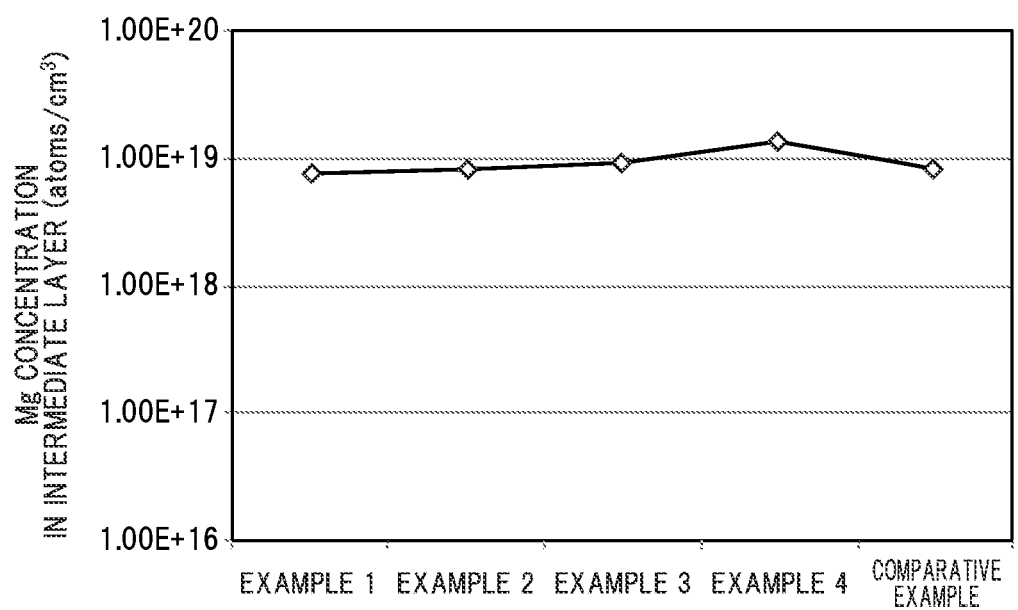

FIG. 4A is a graph showing the Si peak concentrations in the intermediate layers 60 shown in Table 3 in comparison between Examples 1 to 4 and Comparative Example, and FIG. 4B is a graph showing the Mg concentrations in the intermediate layers 60 shown in Table 3 in comparison between Examples 1 to 4 and Comparative Example. As shown in FIG. 4A, the Si peak concentrations in Examples 1 to 4 are higher than the Si peak concentration in Comparative Example (i.e., an average value of the Si concentration in the depth range corresponding to the intermediate layers 60 of the light-emitting elements 1 in Examples 1 to 4). In addition, as shown in Table 3, the Si peak concentration values of the intermediate layers 60 in Examples 1 to 4 were not less than $3.08 \times 10^{18}$ cm$^{-3}$ and not more than $2.13 \times 10^{19}$ cm$^{-3}$. Furthermore, the range of the Mg concentrations in the intermediate layers 60 in Examples 1 to 4 was not less than $7.72 \times 10^{18}$ cm$^{-3}$ and not more than $1.38 \times 10^{19}$ cm'.

Figure 5A:
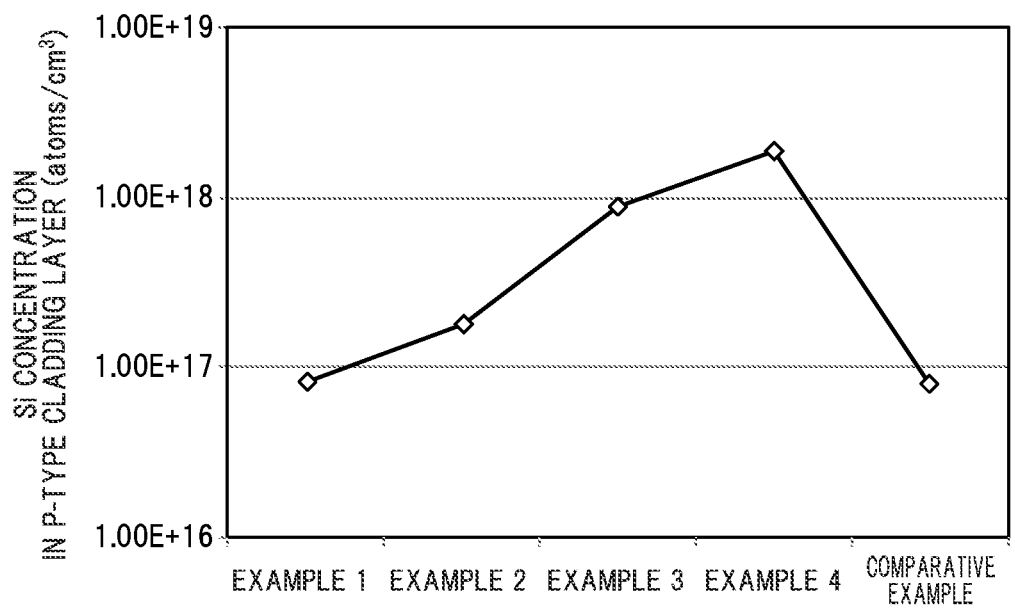
Figure 5B:
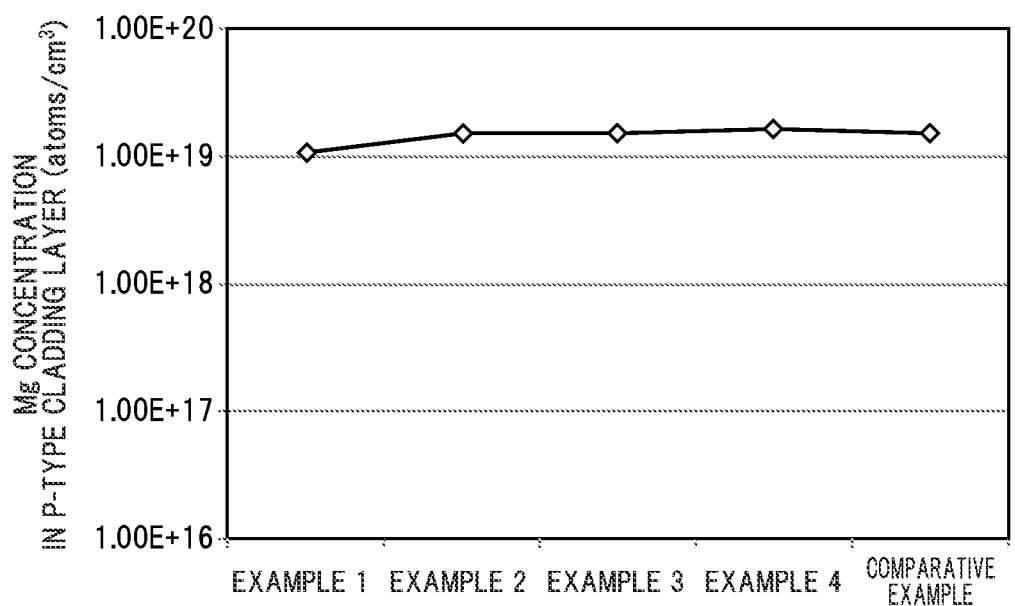

FIG. 5A is a graph showing the Si concentrations in the p-type cladding layers 70 shown in Table 3 in comparison between Examples 1 to 4 and Comparative Example, and FIG. 5B is a graph showing the Mg concentrations in the p-type cladding layers 70 shown in Table 3 in comparison between Examples 1 to 4 and Comparative Example. As shown in FIG. 5A, the Si concentrations in Examples 1 to 4 are higher than the Si concentration in Comparative Example. In addition, as shown in Table 3, the Si concentrations in Examples 1 to 4 were not less than $8.29 \times 10^{16}$ cm$^{-3}$ and not more than $1.86 \times 10^{18}$ cm$^{-3}$. Furthermore, the range of the Mg concentrations in the p-type cladding layers

TABLE 3

Dopants in Intermediate layer 60 and p-type cladding layer 70

|  |  | Example 1 | Example 2 | Example 3 | Example 4 | Comparative Example |
|---|---|---|---|---|---|---|
| Intermediate layer 60 | Si peak concentration (cm$^{-3}$) | $5.79 \times 10^{18}$ | $3.08 \times 10^{18}$ | $6.97 \times 10^{18}$ | $2.13 \times 10^{19}$ | $7.92 \times 10^{16}$ |
|  | O peak concentration (cm$^{-3}$) | $2.05 \times 10^{17}$ | — | — | — | — |
|  | n-type dopant peak concentration (cm$^{-3}$) | $6.00 \times 10^{18}$ | $3.08 \times 10^{18}$ | $6.97 \times 10^{18}$ | $2.13 \times 10^{19}$ | $7.92 \times 10^{16}$ |
|  | Mg concentration (cm$^{-3}$) | $7.72 \times 10^{18}$ | $8.31 \times 10^{18}$ | $9.12 \times 10^{18}$ | $1.38 \times 10^{19}$ | $8.32 \times 10^{18}$ |
| p-type cladding layer 70 | Si concentration (cm$^{-3}$) | $8.29 \times 10^{16}$ | $1.81 \times 10^{17}$ | $8.98 \times 10^{17}$ | $1.86 \times 10^{18}$ | $7.98 \times 10^{16}$ |
|  | O concentration (cm$^{-3}$) | $1.03 \times 10^{17}$ | — | — | — | — |
|  | n-type dopant concentration (cm$^{-3}$) | $1.86 \times 10^{17}$ | $1.81 \times 10^{17}$ | $8.98 \times 10^{17}$ | $1.86 \times 10^{18}$ | $7.98 \times 10^{16}$ |
|  | Mg concentration (cm$^{-3}$) | $1.07 \times 10^{19}$ | $1.51 \times 10^{19}$ | $1.52 \times 10^{19}$ | $1.64 \times 10^{19}$ | $1.51 \times 10^{19}$ |

The light-emitting element in Comparative Example does not include a layer corresponding to the intermediate layers 60 of the light-emitting elements 1 in Examples 1 to 4 as described above. Therefore, an average value in a depth range corresponding to the intermediate layers 60 of the light-emitting elements 1 in Examples 1 to 4 is shown in the "Si peak concentration" of Comparative Example.

70 in Examples 1 to 4 was not less than $1.07 \times 10^{19}$ cm$^{-3}$ and not more than $1.64 \times 10^{19}$ cm$^3$.

In addition, in the p-type cladding layers 70 in Examples 1 to 4, a ratio of the n-type dopant (the Si concentration+the O concentration) to the p-type dopant (the Mg concentration) was respectively $1.73 \times 10^{-2}$, $1.20 \times 10^{-2}$, $5.91 \times 10^{-2}$ and $1.14 \times 10^{-1}$, and had a range of not less than $1.20 \times 10^{-2}$ and not more than $1.14 \times 10^{-1}$. That is, in Examples 1 to 4, the Si concentration in the p-type cladding layer 70 was not less than $1.20 \times 10^{-2}$ times and not more than $1.14 \times 10^{-1}$ times the Mg concentration in the p-type cladding layer 70. In other words, in each of Examples 1 to 4, the Si concentration in the p-type cladding layer 70 was not more than ½ of the Mg concentration in the p-type cladding layer 70.

In addition, particularly in Examples 1, 3 and 4, the ratio of the Si concentration to the Mg concentration in the p-type cladding layer 70 ($1.73 \times 10^{-2}$, $5.91 \times 10^{-2}$ and $1.14 \times 10^{-1}$) had a value included in the range of not less than 1/80 and not more than ¼ described above.

(Emission Lifetime)

Next, the measurement results of emission lifetime of the light-emitting elements 1 in Examples 1 to 4 will be described. The emission lifetime was evaluated using initial emission output (hereinafter, also referred to as "initial output") and a percentage of emission output measured after supplying power for a predetermined time (hereinafter, also referred to as "residual output"). The initial output here is defined as light output obtained from light-emitting elements as-manufactured. The power supplying time was 192 hours. The emission output can be measured by various known methods. In this measurement, as an example, a certain current (e.g., 350 mA) was supplied between the n-side electrode 90 and the p-side electrode 92 which are described above, and emission output was measured by a photodetector placed under the light-emitting elements 1.

Measurement results of the initial output and the residual output are summarized in Table 4 below.

TABLE 4

Measurement results of Initial output and Residual output

| Light-emitting element | Measurement wavelength (nm) | Initial output (mW) (*1) | Residual output (mW) (*2) | Residual percentage (%)(*3) |
|---|---|---|---|---|
| Example 1 | 285 | 121 | 72 | 60 |
| Example 2 | 281 | 119 | 63 | 53 |
| Example 3 | 281 | 111 | 73 | 67 |
| Example 4 | 283 | 126 | 106 | 85 |
| Comparative Example | 281 | 124 | 56 | 46 |

(*1) Initial emission output measured just after the light-emitting elements were manufactured. The current value was 350 mA.
(*2) Emission output measured after supplying power to the light-emitting elements for 192 hours. The current value was 350 mA.
(*3) Value (dimensionless unit) obtained by dividing residual output by initial output.

Figure 6A:
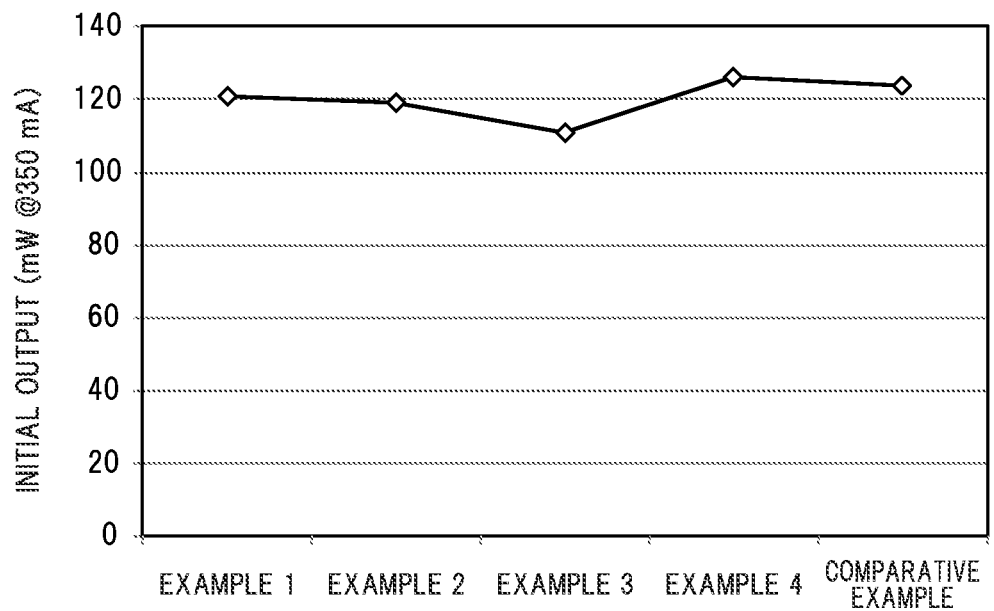
Figure 6B:
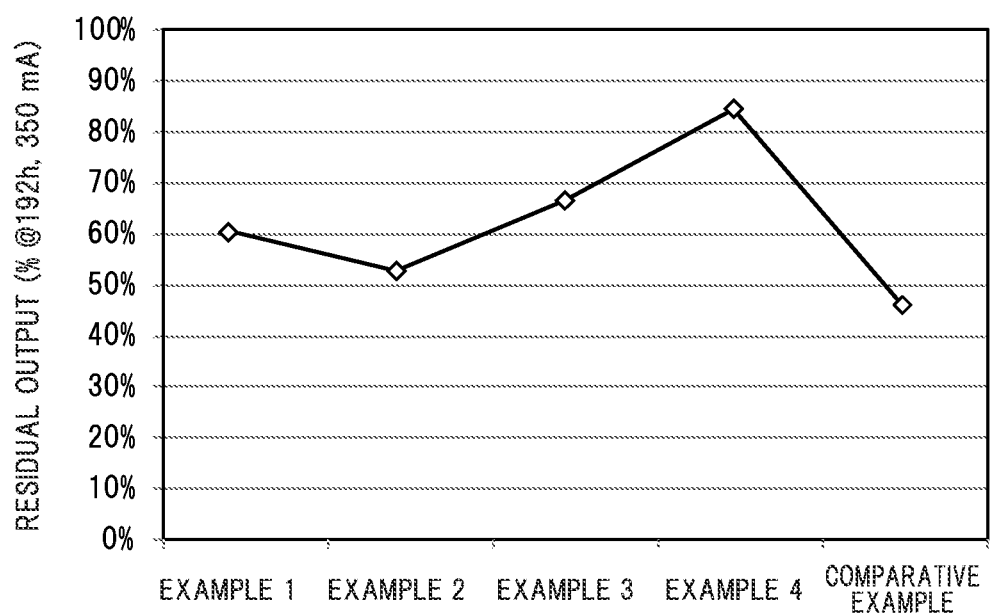

FIGS. 6A and 6B are graphs showing comparisons of initial outputs and residual outputs in Examples and Comparative Example, wherein FIG. 6A is a graph showing the initial outputs and FIG. 6B is a graph showing the residual outputs. As shown in Table 4 and FIG. 6, the residual percentage dropped to 46% in Comparative Example, but it dropped only to 60% in Example 1, 53% in Example 2, 67% in Example 3 and 85% in Example 4. As shown in the measurement results, it was confirmed that the residual percentage is higher in the light-emitting elements 1 in Examples 1 to 4 than in the light-emitting element in Comparative Example.

High residual percentage means that a decrease in emission output after 192-hour power supply is small when compared with the initial output, i.e., emission lifetime is improved. Therefore, the above measurement results confirmed that emission lifetime was improved in the light-emitting elements 1 in Examples 1 to 4 as compared to the light-emitting element in Comparative Example.

<Modification>

The light-emitting element 1 does not necessarily need to include the intermediate layer 60 in the form of layer as in the embodiment and Examples described above as long as the interface between the second electron blocking layer 52 and the p-type cladding layer 70 is doped with not less than a predetermined amount of the n-type dopant. For example, without providing the intermediate layer 60 in the form of layer, a specific region formed in the p-type cladding layer 70 so as to span from the interface with the second electron blocking layer 52 to a predetermined position may be doped with the n-type dopant.

In addition, although the intermediate layer 60 has been described as a layer different from the p-type cladding layer 70 in the embodiment for convenience of explanation, a configuration in which the intermediate layer 60 is included inside the p-type cladding layer 70 on the second electron blocking layer 52-side is also within the technical scope of the light-emitting element 1 of the invention.

(Summary of the Embodiment)

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1), comprising: a light-emitting layer (40) comprising well layers (44a, 44b, 44c) comprising AlGaN and emitting ultraviolet light; an electron blocking layer being located on the light-emitting layer (40) and comprising AlGaN with a first Al composition ratio higher than an Al composition ratio of the well layers (44a, 44b, 44c); and a p-type cladding layer (70) being located on the electron blocking layer, comprising AlGaN with a second Al composition ratio higher than the Al composition ratio of the well layers (44a, 44b, 44c) and lower than the first Al composition ratio, and being doped with a predetermined concentration of a p-type dopant, wherein an interface between the electron blocking layer and the p-type cladding layer (70) is doped with not less than a predetermined amount of an n-type dopant.

[2] The nitride semiconductor light-emitting element (1) described in [1], wherein the p-type cladding layer (70) comprises a diffusion region in which the n-type dopant is diffused from an end on the electron blocking layer side toward a predetermined position.

[3] The nitride semiconductor light-emitting element (1) described in [2], wherein a concentration of the n-type dopant included in the diffusion region is not more than ½ of a concentration of the p-type dopant.

[4] The nitride semiconductor light-emitting element (1) described in [2] or [3], wherein the concentration of the n-type dopant included in the diffusion region is not less than 1/80 and not more than ¼ of the concentration of the p-type dopant.

[5] The nitride semiconductor light-emitting element (1) described in any one of [1] to [4], wherein the concentration of the p-type dopant in the p-type cladding layer is not less than $1.0 \times 10^{18}$ atoms $cm^{-3}$ and not more than $1.0 \times 10^{20}$ atoms $cm^{-3}$.

[6] The nitride semiconductor light-emitting element (1) described in any one of [2] to [5], wherein a distribution of the concentration of the n-type dopant in a thickness direction of the nitride semiconductor light-emitting element (1) has a local maximum in the diffusion region.

[7] The nitride semiconductor light-emitting element (1) described in [6], wherein the local maximum of the n-type dopant is not less than $4.0 \times 10^{18}$ atoms cm$^{-3}$ and not more than $1.0 \times 10^{20}$ atoms cm$^{-3}$.

[8] The nitride semiconductor light-emitting element (1) described in any one of [1] to [7], wherein a concentration of a p-type dopant at the interface between the electron blocking layer and the p-type cladding layer (70) is not less than $1.0 \times 10^{18}$ atoms cm$^{-3}$ and not more than $1.0 \times 10^{20}$ atoms cm$^{-3}$.

[9] The nitride semiconductor light-emitting element (1) described in [8], wherein a distribution of the concentration of the p-type dopant in the thickness direction of the nitride semiconductor light-emitting element (1) has a local maximum at the interface.

[10] A method for manufacturing a nitride semiconductor light-emitting element (1), comprising: forming a light-emitting layer (40) comprising well layers (44a, 44b, 44c) comprising AlGaN and emitting ultraviolet light; forming, on the light-emitting layer (40), an electron blocking layer comprising AlGaN with a first Al composition ratio higher than an Al composition ratio of the well layers (44a, 44b, 44c); intermittently supplying an n-type dopant and a p-type dopant onto an upper surface of the electron blocking layer; and forming, on the electron blocking layer, a p-type cladding layer (70) comprising AlGaN with a second Al composition ratio higher than the Al composition ratio of the well layers (44a, 44b, 44c) and lower than the first Al composition ratio and being doped with a predetermined concentration of a p-type dopant.

What is claimed is:

1. A nitride semiconductor light-emitting element, comprising:
    a light-emitting layer comprising a well layer comprising AlGaN and emitting ultraviolet light;
    an electron blocking layer being located on the light-emitting layer and comprising AlGaN with a first Al composition ratio higher than an Al composition ratio of the well layer; and
    a p-type cladding layer being located on the electron blocking layer, comprising AlGaN with a second Al composition ratio higher than the Al composition ratio of the well layer and lower than the first Al composition ratio, and being doped with a predetermined concentration of a p-type dopant,
    wherein an interface between the electron blocking layer and the p-type cladding layer is doped with not less than a predetermined amount of an n-type dopant;
    wherein the p-type cladding layer comprises a diffusion region in which the n-type dopant is diffused from an end on the electron blocking layer side toward a predetermined position; and
    wherein a distribution of the concentration of the n-type dopant in a thickness direction of the nitride semiconductor light-emitting element has a local maximum in the diffusion region.

2. The nitride semiconductor light-emitting element according to claim 1, wherein a concentration of the n-type dopant included in the diffusion region is not more than ½ of a concentration of the p-type dopant.

3. The nitride semiconductor light-emitting element according to claim 1, wherein the concentration of the n-type dopant included in the diffusion region is not less than 1/80 and not more than ¼ of the concentration of the p-type dopant.

4. The nitride semiconductor light-emitting element according to claim 1, wherein the concentration of the p-type dopant in the p-type cladding layer is not less than $1.0 \times 10^{18}$ atoms cm$^{-3}$ and not more than $1.0 \times 10^{20}$ atoms cm$^{-3}$.

5. The nitride semiconductor light-emitting element according to claim 1, wherein the local maximum of the n-type dopant is not less than $4.0 \times 10^{18}$ atoms cm$^{-3}$ and not more than $1.0 \times 10^{20}$ atoms cm$^{-3}$.

6. The nitride semiconductor light-emitting element according to claim 1, wherein a concentration of a p-type dopant at the interface between the electron blocking layer and the p-type cladding layer is not less than $1.0 \times 10^{18}$ atoms cm$^{-3}$ and not more than $1.0 \times 10^{20}$ atoms cm$^{-3}$.

7. The nitride semiconductor light-emitting element according to claim 6, wherein a distribution of the concentration of the p-type dopant in the thickness direction of the nitride semiconductor light-emitting element has a local maximum at the interface.

* * * * *